United States Patent [19]

Suzuki

[11] Patent Number: 5,100,333

[45] Date of Patent: Mar. 31, 1992

[54] ELECTRONIC PACKAGE SOCKET

[75] Inventor: Masao Suzuki, Tokyo, Japan

[73] Assignee: Thomas & Betts Corporation, Bridgewater, N.J.

[21] Appl. No.: 621,187

[22] Filed: Nov. 30, 1990

[30] Foreign Application Priority Data

Dec. 8, 1989 [JP] Japan ............... 1-141661[U]

[51] Int. Cl.$^5$ ............................................. H01R 9/09
[52] U.S. Cl. ...................................... 439/73; 439/72; 439/487
[58] Field of Search .............. 439/70, 72, 73, 485, 439/487

[56] References Cited

U.S. PATENT DOCUMENTS

| | | | |
|---|---|---|---|
| 3,656,183 | 4/1972 | Walterscheid | 439/73 |
| 3,904,262 | 9/1975 | Cutchaw | 439/487 |
| 4,026,412 | 5/1977 | Kenson | 439/487 |
| 4,433,886 | 2/1984 | Cassarly et al. | 339/14 |
| 4,460,223 | 7/1984 | Brown et al. | 339/14 |
| 4,515,425 | 5/1985 | Nakano | 439/73 |
| 4,560,217 | 12/1985 | Siano | 339/14 |
| 4,824,392 | 4/1989 | Billman et al. | 439/73 |
| 5,007,825 | 4/1991 | Grabbe | 439/73 |

Primary Examiner—Paula A. Bradley
Attorney, Agent, or Firm—Robert M. Rodrick; Salvatore J. Abbruzzese

[57] ABSTRACT

A socket comprises a housing member having a recess for receiving an electronic package therein, the housing member supporting a plurality of contact members for making contact with respective leads of the electronic package. A cover is pivotally mounted on the housing member for covering the electronic package received in the recess and for holding the electronic package therein under pressure. An adapter is provided for receipt in the housing member, the adapter having means for receiving and aligning the leads of the electronic package in a preferred pattern. The adapter has an opening therein arranged to communicate with the electronic package in assembly. The cover is made of aluminum or other good thermally conductive material and includes a recessed portion projecting inwardly through the adapter opening for making contact with the electronic package. As such, in assembly, heat generated by the electronic package is effectively released through the cover.

7 Claims, 4 Drawing Sheets

ELECTRONIC PACKAGE SOCKET

FIELD OF THE INVENTION

The present invention relates to a socket for an electronic package, having excellent heat sink characteristics.

BACKGROUND OF THE INVENTION

There is known a socket having a cover or frame for pressing down an electronic element, such as an integrated circuit (IC) to hold it therein securely. Regarding some electronic parts, in particular an IC of great integration density, there have been problems in releasing heat generated by the IC. This problem is similar to a connector for connecting such an IC.

SUMMARY OF THE INVENTION

The present invention provides a socket comprising a housing member having a recess for receiving an electronic package, a plurality of contact members for making contact with leads of the electronic package, a cover for covering the electronic package received in the recess, and holding the electronic package under pressure, and an adapter for covering side edges of the electronic element. The adapter has means for aligning the leads of the electronic package in order and an opening arranged to communicate with the electronic package. Each contact member is arranged to have one end portion thereof adjacent a bottom of the recess of the housing member and another end portion thereof extending out from the housing member. The cover is made of material having good thermal conductivity and includes a portion protruding inwardly through the adapter opening for making contact with the electronic package.

DETAILED DESCRIPTION OF THE PREFERRED EMBODIMENT

Figure 1:
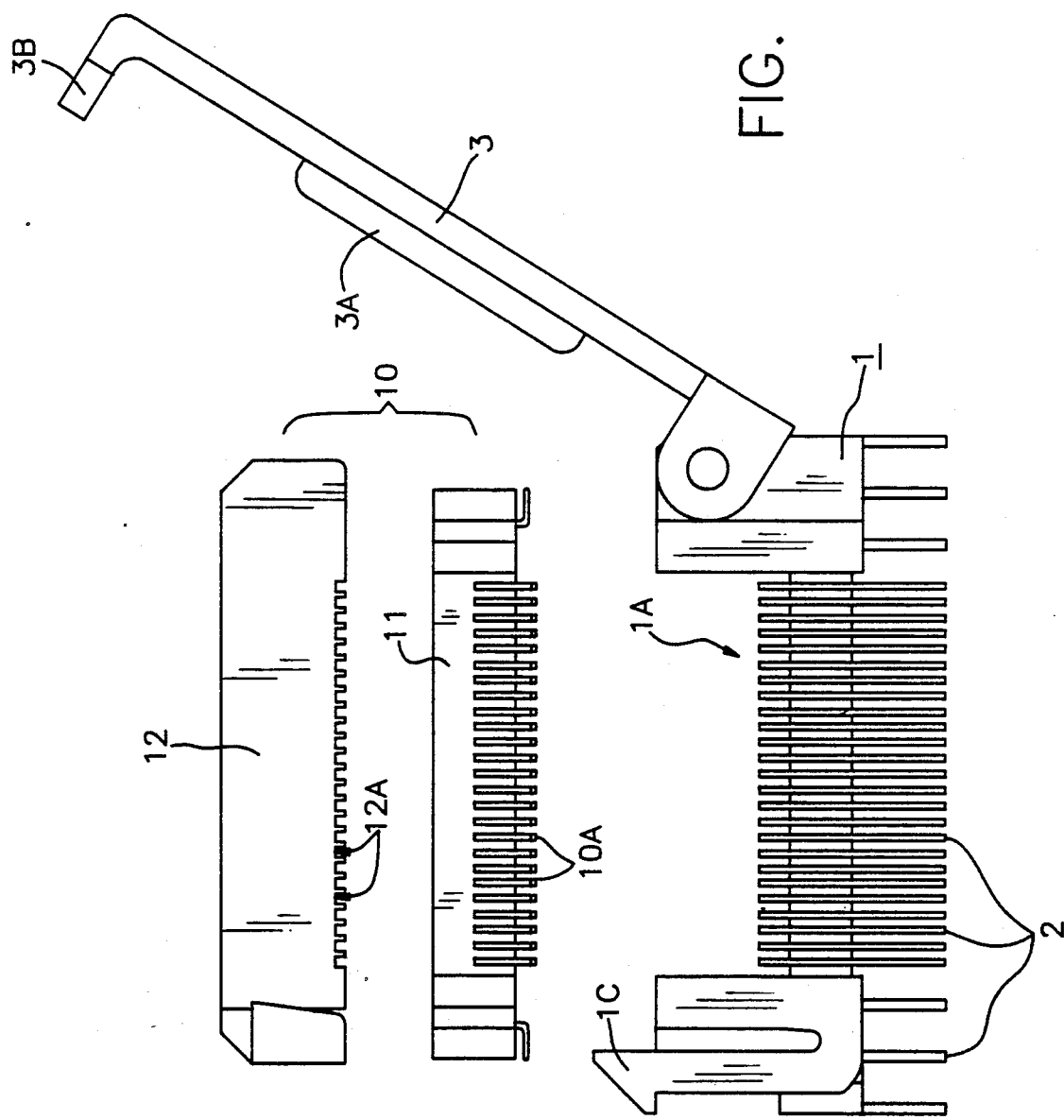
FIG. 1 is a side elevation view showing in exploded fashion a socket according to one embodiment of the present invention, before mounting an electronic package in the socket.

FIG. 1 shows an overall view of a socket according to a preferred form of the present invention. In the drawing, the reference numeral 1 denotes a housing member having a recess 1A for receiving an electronic package 10. Numeral 2 denotes a contact member for making contact with terminals, leads, electrodes 10A or the like of the electronic package mounted in the housing member. Numeral 3 denotes a cover for covering the electronic package in the housing member while holding the package under pressure. The electronic package comprises an electronic element 11 such as an IC, and an adapter 12 for covering side edges of the electronic element.

Figure 2:
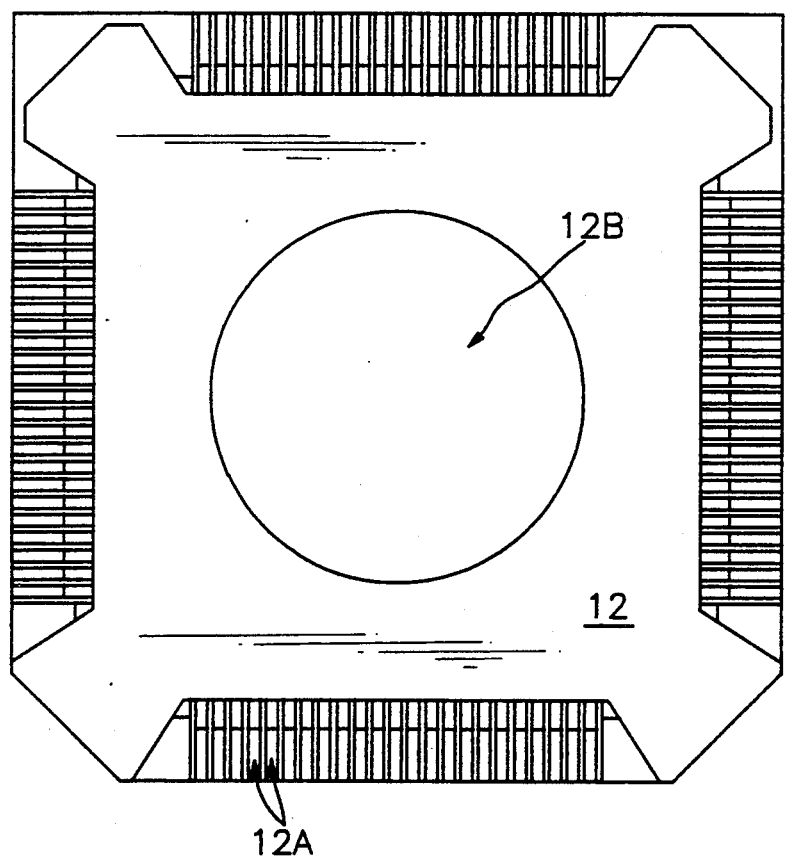
FIG. 2 is a bottom view showing an adapter of the socket of the embodiment of FIG. 1.

FIG. 2 shows a bottom view of the adapter. According to the drawing, the adapter 12 has slits 12A for aligning the leads of the IC in order, and an opening 12B which will be described later.

Figure 3:
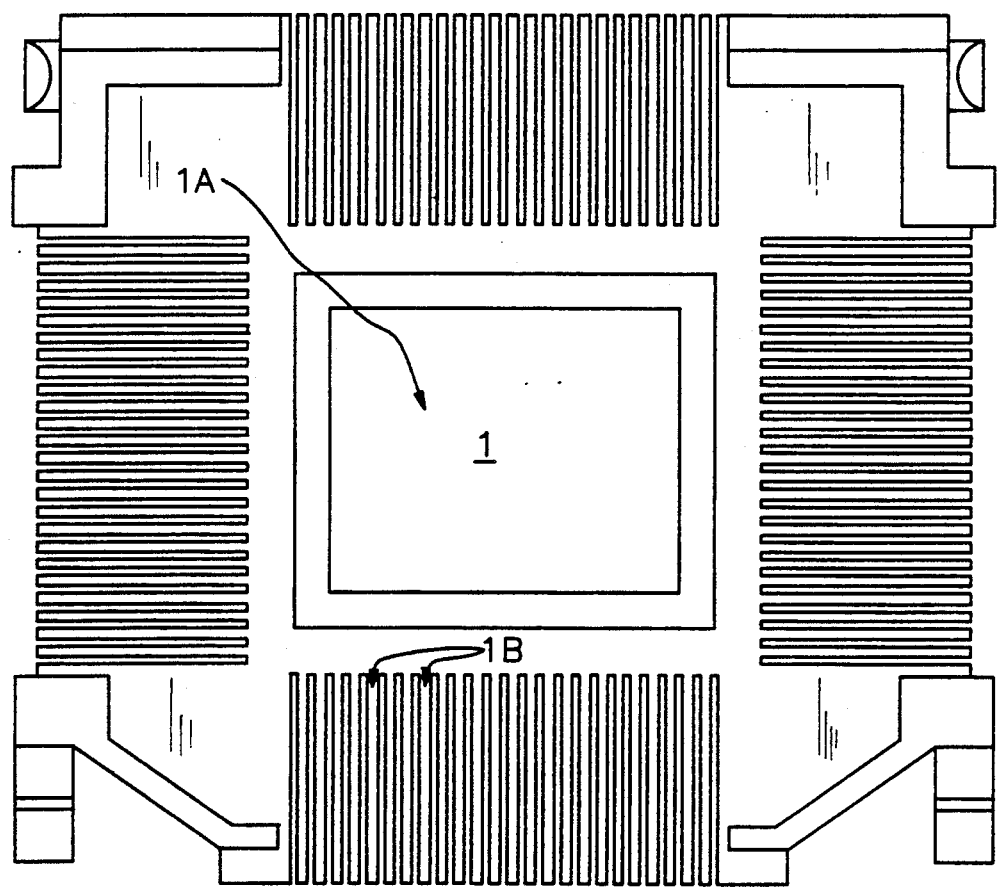
FIG. 3 is a plan view showing a housing member of the socket of FIG. 1.

FIG. 3 shows the housing member of the socket according to the preferred embodiment. In the vicinity of the recess 1A of the housing member, grooves 1B are provided to arrange therein the contact members 2 in order. One end portion of each of the contact members in the grooves is exposed at a bottom of the recess 1A of the housing member (see FIGS. 1, 5 and 6) and the other portion of the contact member extends out of the housing member.

Figure 4:
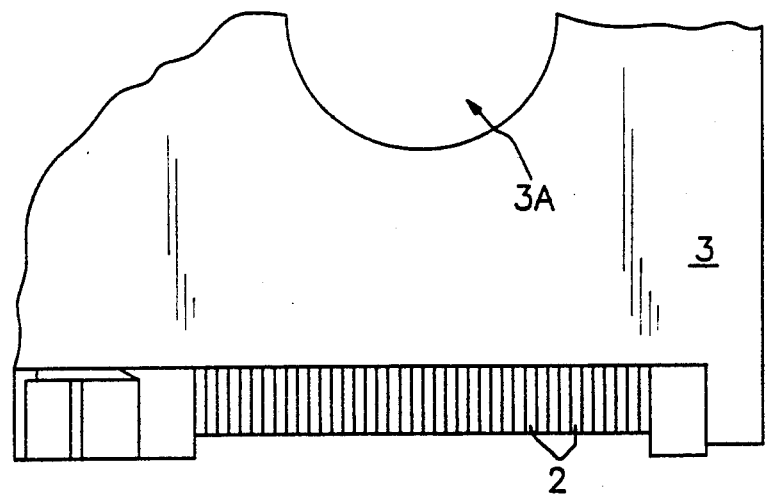
FIG. 4 is a partial plan view showing the cover of the socket with an electronic package mounted therein.
Figure 5:
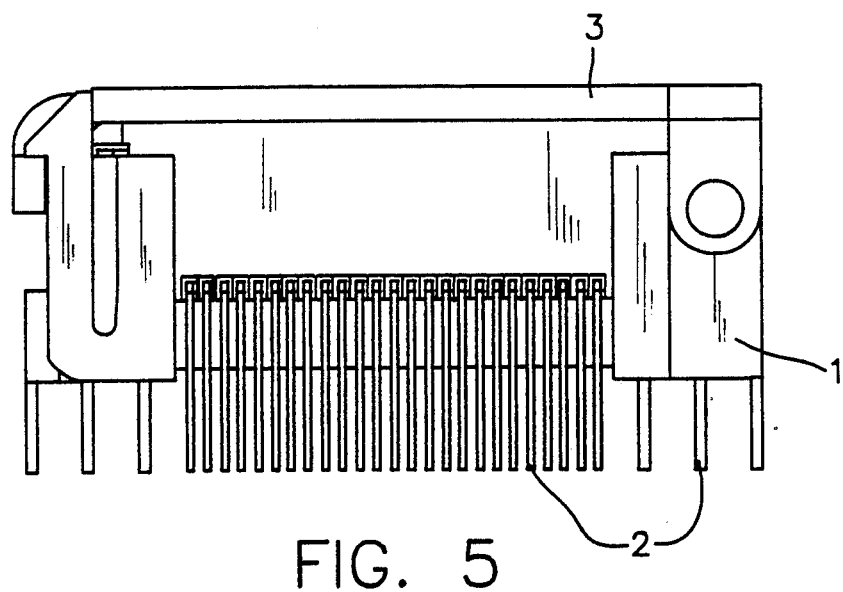
FIGS. 5 and 6 are, respectively, a front view and a vertical sectional view, showing an electronic package mounted in the socket of the preferred embodiment.
Figure 6:
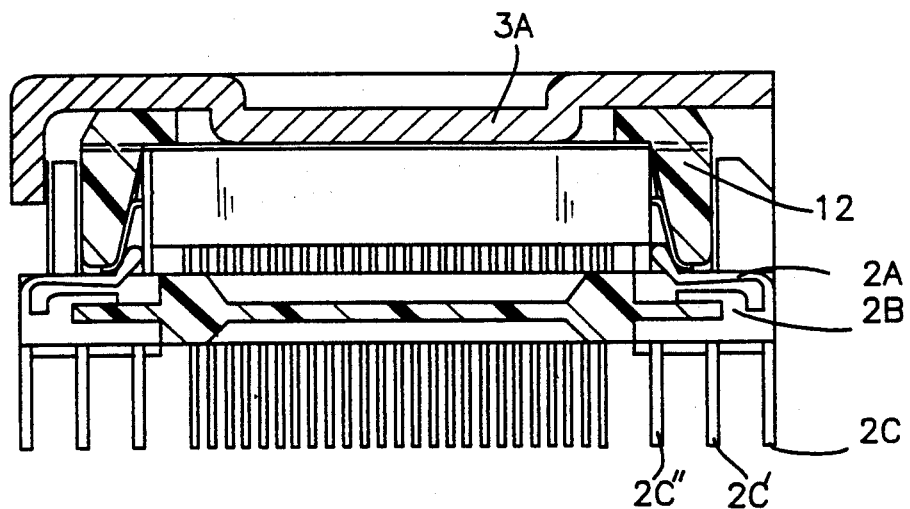

FIGS. 4 to 6 show the socket in which the electronic package is mounted. In the drawings, the cover 3 is made of material having good thermal conductivity, such as aluminum, and has a portion 3A recessed or protruding inwardly for making a face contact with the electronic package. The portion 3A is inserted through the opening 12B of the adapter 12, as described, to make contact with a surface of the electronic element mounted in the housing member. Also, one side edge of the cover 3 is pivotally mounted on a sidewall of the housing member defining the recess. The other side edge of the cover and a sidewall of the housing member opposed to the side edge of the cover comprise latches (3B, 1C) for latching the cover with the housing member.

The contact member 2 comprises a spring contact 2A for making contact with the terminal or lead of the electronic package, a locking portion 2B for locking to a part of a bottom portion of the housing, and a terminal 2C extending downward out of the housing member (see FIG. 6). In the illustrated embodiment, an end portion of the spring contact is bent obliquely upward. As indicated by numerals 2C, 2C', and 2C" of FIG. 6, the terminals are of three different types. The three types of terminals are different from each other in position on the bottom of the housing member from which the terminals extend downwardly.

In the attachment of the electronic element to the socket of the socket, the leads of the element are first received in the adapter in order, and then the adapter holding the element therein is mounted in the housing member. Finally, the housing member receiving the adapter therein is covered by the cover and at the same time the cover and the housing member are latched by the latching means. At such time, the portion of the cover recessed or protruding inwardly is inserted through the opening of the adapter to make contact with the surface of the electronic element mounted in the housing member. Since the portion of the cover is made of material having good thermal conductivity, such as aluminum, heat generated by the electronic element is released through the cover.

As such, the socket according to the present invention can not only effectively hold therein the leads of the electronic element in order, but can also effectively release the heat generated by the electronic element.

Also, as seen from FIG. 6, since the leads of the electronic element are pushed by the side edge of the adapter to make contact with the respective portions of the spring contacts bent obliquely upward, they can engage with the contacts securely and uniformly.

Having described the preferred embodiment of the socket herein, it can be appreciated that variations may be made thereto without departing from the contemplated scope of the invention. Accordingly, the preferred embodiment is intended to be illustrative rather than limiting. The true scope of the invention is set forth in the claims appended hereto.

I claim:

1. A socket comprising a housing member (1) having a recess (1A) for receiving an electronic package (10), a plurality of contact members (2) for making contact with leads (10A) of said electronic package, a cover (3) for covering said electronic package received in said recess and holding said electronic package under pressure, and an adapter (12) for covering portions of said electronic package, said adapter having means for aligning the leads of said electronic package in order, and an opening (12B) arranged to communicate with said electronic package, each said contact member being arranged to have one end portion thereof adjacent a bottom of said recess of said housing member and another end portion thereof extending out from said housing member, said cover being made of material having good thermal conductivity and including a portion (3A) protruding inwardly through said adapter opening for making contact with said electronic package on a surface thereof remote from said leads (10A).

2. A socket according to claim 1, wherein each of said contact members (2) comprises a spring contact (2A) for making contact with the leads of said electronic package, a locking portion (2B) for locking to a part of a bottom portion of said housing member, and a terminal (2C) extending out from said housing member.

3. A socket according to claim 2, wherein one side edge of said cover is pivotally mounted on a sidewall of said housing member defining said recess, and another side edge of said cover and a sidewall of said housing opposed to said side edge include latching means (3B, 1C) for latching said cover with said housing member.

4. A socket according to claim 2, wherein terminals (2C), (2C'), (2C'') of said contact members are differently configured from each other.

5. A socket according to claim 2, wherein an end portion of a spring contact is bent obliquely upward toward said recess.

6. A socket according to claim 5, wherein said adapter includes spaced slits (12A) arranged around its periphery to receive and align leads of said electronic package.

7. A socket according to claim 6, wherein a side edge of said adapter is arranged to cause contact between leads of said electronic package and said obliquely bent portions of spring contacts.

* * * * *